(12) United States Patent
Wong et al.

(10) Patent No.: US 6,319,655 B1
(45) Date of Patent: Nov. 20, 2001

(54) MODIFICATION OF 193 NM SENSITIVE PHOTORESIST MATERIALS BY ELECTRON BEAM EXPOSURE

(75) Inventors: Selmer Wong; Matthew Ross, both of San Diego, CA (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/330,710

(22) Filed: Jun. 11, 1999

(51) Int. Cl.$^7$ ........................................................ G03F 7/00
(52) U.S. Cl. ........................ 430/311; 430/328; 430/330; 430/942
(58) Field of Search ................................ 430/270.1, 296, 430/329, 330, 328, 311, 942; 250/492.2

(56) References Cited

U.S. PATENT DOCUMENTS

| | | | |
|---|---|---|---|
| Re. 35,821 | * 6/1998 | Niki et al. | 430/326 |
| 4,904,866 | 2/1990 | Collins et al. | |
| 5,326,675 | * 7/1994 | Niki et al. | 430/326 |
| 5,550,008 | 8/1996 | Tomo et al. | |
| 5,648,198 | 7/1997 | Shibata | |
| 5,908,732 | * 6/1999 | Aviram et al. | 430/296 |
| 5,942,373 | * 8/1999 | Chou et al. | 430/296 |
| 5,955,242 | * 9/1999 | Aviram et al. | 430/296 |
| 5,976,284 | * 11/1999 | Calvert et al. | 156/51 |
| 6,017,677 | * 1/2000 | Maemoto et al. | 430/270.1 |
| 6,020,107 | * 2/2000 | Niiyama et al. | 430/296 |
| 6,060,213 | * 5/2000 | Kodama | 430/270.1 |
| 6,063,549 | * 5/2000 | Schadeli et al. | 430/325 |
| 6,074,800 | 6/2000 | Breyta et al. | |
| 6,087,076 | * 7/2000 | Sakai et al. | 430/327 |
| 6,103,445 | * 8/2000 | Willson et al. | 430/270.1 |

FOREIGN PATENT DOCUMENTS

| | | |
|---|---|---|
| 0 094 247 | 10/1983 | (EP) . |
| 0 794 458 A2 | 4/1997 | (EP) . |
| 0 986 072 A2 | 9/1999 | (EP) . |

OTHER PUBLICATIONS

IBM Technical Disclosure Bulletin, vol. 23, No. 8, Jan. 1981, XP–002146841, Single–Layer Photoresist Profiling, H. Bohlen, et al.

Uzodinma Okoroanyanwu, et al; "Progress in 193 nm Photoresists and Related Process Technologies"; Proceedings of the Interface 98 Microlithography Symposium; Nov. 15, 1998; San Diego, California.

* cited by examiner

*Primary Examiner*—Kathleen Duda
(74) *Attorney, Agent, or Firm*—Roberts & Mercanti LLP

(57) ABSTRACT

A process for increasing the etch resistance of photoresists, especially positive working 193 nm sensitive photoresists which are suitable for use in the production of microelectronic devices such as integrated circuits. A 193 nm photosensitive composition is coated onto a substrate, exposed to activating energy at a wavelength of 193 nm to decompose the polymer in the imagewise exposed areas; and developed to remove the exposed nonimage areas. Then the image areas are exposed to sufficient electron beam radiation to increase the resistance of the image areas to an etchant.

28 Claims, 1 Drawing Sheet

MODIFICATION OF 193 NM SENSITIVE PHOTORESIST MATERIALS BY ELECTRON BEAM EXPOSURE

BACKGROUND OF THE INVENTION

1. Field of the Invention

The present invention relates to a process for increasing the etch resistance of photoresists which are suitable for use in the production of microelectronic devices such as integrated circuits. More particularly, the invention provides a process for increasing the etch resistance of positive working 193 nm sensitive photoresists.

2. Description of the Related Art

The production of positive photoresists is well known in the art as exemplified by U.S. Pat. Nos. 3,666,473; 4,115,128 and 4,173,470. These contain aqueous alkali soluble polyvinyl phenol or phenol formaldehyde novolak resins together with light sensitive materials, usually a substituted naphthoquinone diazide compound. The resins and sensitizers are dissolved in an organic solvent and are applied as a thin film coating to a substrate suitable for the particular application desired. The resin component of photoresist formulations is soluble in an aqueous alkaline solution, but the photosensitizer is not. Upon imagewise exposure of the coated substrate to actinic radiation, the exposed areas of the coating are rendered more soluble than the unexposed areas. This difference in solubility rates causes the exposed areas of the photoresist coating to be dissolved when the substrate is immersed in an alkaline developing solution, while the unexposed areas are substantially unaffected, thus producing a positive image on the substrate. The uncovered substrate is thereafter subjected to an etching process. Frequently, this involves a plasma etching against which the resist coating must be sufficiently stable. The photoresist coating protects the covered areas of the substrate from the etchant and thus the etchant is only able to etch the uncovered areas of the substrate. Thus, a pattern can be created on the substrate which corresponds to the pattern of the mask or template that was used to create selective exposure patterns on the coated substrate prior to development.

Photoresists are either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. The ability to reproduce very small dimensions, is extremely important in the production of large scale integrated circuits on silicon chips and similar components. As the integration degree of semiconductor devices becomes higher, finer photoresist film patterns are required. One way to increase circuit density on such a chip is by increasing the resolution capabilities of the resist. Positive photoresists have been found to be capable of much higher resolution and have almost universally replaced negative resists for this purpose.

The optimally obtainable microlithographic resolution is essentially determined by the radiation wavelengths used for the selective irradiation. However the resolution capacity that can be obtained with conventional deep UV microlithography has its limits. In order to be able to sufficiently resolve optically small structural elements, wavelengths shorter than deep UV radiation must be utilized. The use of UV radiation has been employed for many applications, particularly radiation with a wavelength of 193 nm. In particular, the radiation of argon fluoride excimer lasers, which has a wavelength of 193 nm is useful for this purpose. The deep UV photoresist materials that are used today, however, are not suitable for 193 nm exposure. Materials based on phenolic resins as a binding agent, particularly novolak resins or polyhydroxystyrene derivatives have too high an absorption at wavelengths below 200 nm and one cannot image through films of the necessary thickness. This high absorption at 193 nm radiation results in side walls of the developed resist structures which do not form the desired vertical profiles. Rather they have an oblique angle with the substrate which causes poor optical resolution characteristics at these short wavelengths. Polyhydroxystyrene based resists can be used in top surface imaging applications in which a very thin (~500 Å) layer of resist is required to be transparent at the ArF wavelength. This invention involves the use of 193 nm resists in single layer processes.

Chemical amplification resist films have been developed, which have been found to have superior resolution. 193 nm photoresists are based on chemically amplified deprotection. With this mechanism, a molecule of photogenerated acid catalyzes the breaking of bonds in a protecting group of a polymer. During the deprotecting process, another molecule of the same acid is created as a byproduct, and continues the acid-catalytic deprotection cycle. The chemistry of a 193 nm photoresist is based on polymers such as, but not limited to, acrylates, cyclic olefins with alicyclic groups, and hybrids of the aforementioned polymers which lack aromatic rings, which contribute to opacity at 193 nm. It has thus been known to utilize photoresists based on methacrylate resins for the production of microstructures by means of 193 nm radiation.

However, chemically amplified resist films have not played a significant role in the fine pattern process using deep UV because they lack sufficient etch resistance, thermal stability, post exposure delay stability and processing latitude. While such photoresists are sufficiently transparent for 193 nm radiation, they do not have the etching stability customary for resists based on phenolic resins for plasma etching. A typical chemical amplification photoresist film comprises a polymer, a photoacid generator, and other optional additives. The polymer is required to be soluble in the chosen developer solution, and have high thermal stability and low absorbance to the 193 nm exposure wavelength in addition to having excellent etch resistance. Since resists containing aromatic compounds show high absorbance to ArF (193 nm) while non-aromatic matrix resins have a poor etch resistance, these contrasting weak points are factors retarding the development of excellent photoresist films for ArF lithography. It would be desirable to overcome the above mentioned problems and to provide a photoresist film superior in etch resistance, as well as transmittance to deep UV.

There have been several attempts to solve this problem. One attempt to improve the etching stability of photoresists based on meth(acrylate) introduced cycloaliphatic groups into the meth(acrylate) polymers. This leads to an improvement in etching stability, but not to the desired extent. Another proposal aims at producing sufficient etching stability only after irradiation in the resist coating. It has been proposed to treat the substrate with the finished, developed, image-structured photoresist coating with specific alkyl compounds of magnesium or aluminum, in order to introduce the given metals in the resist material as etching barriers (See U.S. Pat. No. 4,690,838). The use of metal-containing reagents, however, is generally not desired in microlithography process, due to the danger associated with contamination of the substrate with metal ions.

It has now been found according to the present invention, that by subjecting a developed photoresist to electron beam irradiation, a resist image is produced which is still sufficiently transparent for radiation with a wavelength of approximately 193 nm and which is now sufficiently stable to permit plasma etching. In this way, it is possible to produce a photoresist which can be exposed at approximately 193 nm wavelength, which also has an etching rate that is comparable to conventional resists based on phenolic resin, without needing to treat the resist coating with metal compounds in order to increase the etching stability. The present invention therefore provides a process for increasing the etch stability of photoresist compositions which are transparent at a wavelength of approximately 193 nm.

SUMMARY OF THE INVENTION

The invention provides a process for producing an etch resistant image which comprises:

(a) coating and drying a photosensitive composition onto a substrate, which photosensitive composition comprises
  (i) at least one water insoluble, acid decomposable polymer which is substantially transparent to ultraviolet radiation at a wavelength of about 193 nm, wherein said polymer is present in the photosensitive composition in an amount sufficient to form a uniform film of the composition components when it is coated on a substrate and dried;
  (ii) at least one photosensitive compound capable of generating an acid upon exposure to sufficient activating energy at a wavelength of about 193 nm, said photosensitive compound being present in an amount sufficient to substantially uniformly photosensitize the photosensitive composition;

(b) imagewise exposing the photosensitive composition to sufficient activating energy at a wavelength of 193 nm to cause the photosensitive compound to generate sufficient acid to decompose the polymer in the imagewise exposed areas of the photosensitive composition;

(c) developing the photosensitive composition to thereby remove the exposed nonimage areas and leaving the unexposed image areas of the photosensitive composition;

(d) irradiating the image areas of the photosensitive composition to sufficient electron beam radiation to thereby increase the resistance of the photosensitive composition in the image areas to an etchant.

The invention also provides a process for producing a microelectronic device image which comprises:

(a) coating and drying a photosensitive composition onto a semiconductor substrate, which photosensitive composition comprises
  (i) at least one water insoluble, acid decomposable polymer which is substantially transparent to ultraviolet radiation at a wavelength of about 193 nm, wherein said polymer is present in the photosensitive composition in an amount sufficient to form a uniform film of the composition components when it is coated on a substrate and dried;
  (ii) at least one photosensitive compound capable of generating an acid upon exposure to sufficient activating energy at a wavelength of about 193 nm, said photosensitive compound being present in an amount sufficient to substantially uniformly photosensitize the photosensitive composition;

(b) imagewise exposing the photosensitive composition to sufficient activating energy at a wavelength of 193 nm to cause the photosensitive compound to generate sufficient acid to decompose the polymer in the imagewise exposed areas of the photosensitive composition;

(c) developing the photosensitive composition to thereby remove the exposed nonimage areas and leaving the unexposed image areas of the photosensitive composition;

(d) irradiating the image areas of the photosensitive composition to sufficient electron beam radiation to thereby increase the resistance of the photosensitive composition in the image areas to an etchant.

The invention further provides a microelectronic device image produced by a process which comprises:

(a) coating and drying a photosensitive composition onto a semiconductor substrate, which photosensitive composition comprises
  (i) at least one water insoluble, acid decomposable polymer which is substantially transparent to ultraviolet radiation at a wavelength of about 193 nm, wherein said polymer is present in the photosensitive composition in an amount sufficient to form a uniform film of the composition components when it is coated on a substrate and dried;
  (ii) at least one photosensitive compound capable of generating an acid upon exposure to sufficient activating energy at a wavelength of about 193 nm, said photosensitive compound being present in an amount sufficient to substantially uniformly photosensitive the photosensitive composition; p1 (b) imagewise exposing the photosensitive composition to sufficient activating energy at a wavelength of 193 nm to cause the photosensitive compound to generate sufficient acid to decompose the polymer in the imagewise exposed areas of the photosensitive composition;

(c) developing the photosensitive composition to thereby remove the exposed nonimage areas and leaving the unexposed image areas of the photosensitive composition;

(d) irradiating the image areas of the photosensitive composition to sufficient electron beam radiation to thereby increase the resistance of the photosensitive composition in the image areas to an etchant.

DETAILED DESCRIPTION OF THE PREFERRED EMBODIMENT

Figure 1:
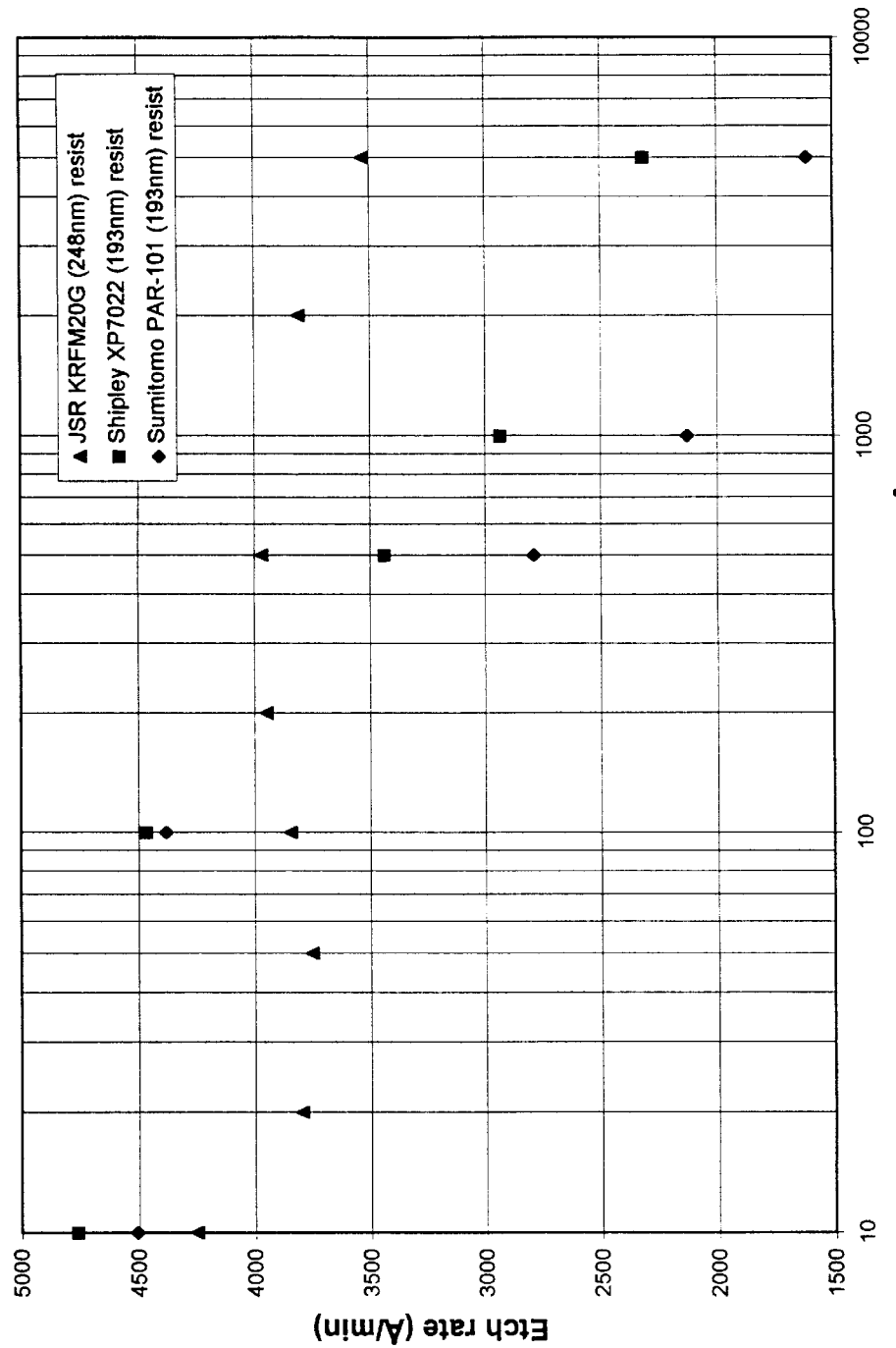
FIG. 1 shows a graph comparing etch rates for two 193 nm resists and a 248 nm resist.

The first step of the process according to the invention is coating and drying a photosensitive composition onto a substrate. The photosensitive compositions useful for the invention are themselves well known in the art and are composed of a mixture of a water insoluble, acid decomposable polymer which is substantially transparent to ultraviolet radiation at a wavelength of about 193 nm, a photosensitive compound capable of generating an acid upon exposure to sufficient activating energy at a wavelength of about 193 nm, and optional other ingredients.

Suitable substrates nonexclusively include silicon, aluminum, lithium niobate, polymeric resins, silicon dioxide, doped silicon dioxide, gallium arsenide, Group III/V compounds, silicon nitride, tantalum, copper, polysilicon, ceramics and aluminum/copper mixtures. Semiconductor substrates are most preferred. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

Acid decomposable polymers suitable for a chemical amplification resist film for ArF laser exposure which are substantially transparent at 193 nm are well known in the art and nonexclusively include cyclic olefins, and acrylics and methacrylates such as polyalkylacrylates and polyalkylmethacrylates, norbornene containing polymers, and alicyclic polymers. Cyclic olefin materials offer superior etch resistance, surpassing even that of novolac materials. The most widely employed route involves free radical copolymerization of maleic anhydride with a cyclic olefin monomer. The maleic anhydride serves as an oxygen-rich polar unit whose hydrophilic nature offsets the hydrophobic nature of the cyclic olefin monomer. Others polymers include polymethylacrylate and polymethylmethacrylate (PMMA) as well as copolymers thereof and polymers which have a backbone of polymethylmethacrylate having pendant groups which do not substantially reduce the transparency of the polymer at 193 nm. PMMA has a particularly high transmittance to the light of 193 nm wavelength and it is known for its clarity, surface hardness, UV transparency and chemical resistance PMMA is readily commercially available from Aldrich Chemical Company of Milwaukee, Wis. Preferably the polymer has a molecular weight in the range of from about 1,000 to about 800,000. Alicyclic polymers include acrylate/alicyclic polymers such as hybrid polymers produced by the free radical copolymerization of norbornene, maleic anhydride and either acrylic acid or t-butyl acrylate. A terpolymer of acrylonitrile, tertiary-butyl methacrylate and methacrylic acid has also been shown to have high transparency at 193 nm and excellent dry etch resistance.

Useful photosensitive compounds capable of generating an acid upon exposure to sufficient activating energy at a wavelength of about 193 nm include onium salts such as sulfonium, diazonium and iodonium salts. Sulfonium salts are described in U.S. Pat. No. 4,537,854; diazonium salts are described in Light Sensitive Systems, Kosar, J.; John Wiley & Sons, New York, 1965. Iodonium salts are described in U.S. Pat. No. 4,603,101.

The light sensitive composition may be formed by admixing the ingredients in a suitable solvent composition. In the preferred embodiment the polymer is preferably present in the overall composition in an amount of from about 50% to about 99% based on the weight of the solid, i.e. non-solvent parts of the composition. A more preferred range of copolymer would be from about 80% to about 99% and most preferably from about 82% to about 95% by weight of the solid composition parts. The photosensitive compound is preferably present in an amount ranging from about 1% to about 20% based on the weight of the solid, i.e., non-solvent parts of the composition. A more preferred range of the photosensitive compound would be from about 5% to about 20% by weight of the solid composition parts. In preparing the composition, the polymer and photosensitive compound are mixed with a sufficient amount of a solvent composition to form a uniform solution. Such solvents include propylene glycol alkyl ether acetate, butyl acetate, ethylene glycol monoethyl ether acetate, diglyme, cyclopentanone and propylene glycol methyl ether acetate, among others. The composition may additionally contain additives such as colorants, dyes, antistriation agents, leveling agents, crosslinkers, plasticizers, adhesion promoters, speed enhancers, solvents, acid generators, dissolution inhibitors and non-ionic surfactants.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) in an amount of from about 1.0 to about 10.0 percent, based on the combined weight of the solid parts of the composition. The dye additives help provide increased resolution by inhibiting back scattering of light off the substrate. Anti-striation agents may be used up to five percent weight level, based on the combined weight of solids. Adhesion promoters which may be used include, for example, beta-(3,4-epoxy-cyclohexyl)ethyltrimethoxysilane; p-methyl-disilane-methyl methacrylate; vinyltrichlorosilane; and gamma-amino-propyl triethoxysilane up to a 4.0 percent based on the combined weight of solids. Speed enhancers that may be used include, for example, picric acid, nicotinic acid or nitrocinnamic acid at up to 20 percent, based on the combined weight of copolymer and solids. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas. Non-ionic surfactants that may be used include, for example, nonylphenoxy poly (ethyleneoxy)ethanol; octylphenoxy(ethyleneoxy)ethanol; and dinonyl phenoxy poly(ethyleneoxy)ethanol at up to 10 percent based on the combined weight of solids.

Photoresists which are photosensitive at 193 nm are well known in the art and widely commercially available, Such include K98 and D3 available from the Shipley Company; 620-10 from Olin Microelectronics Materials, AM01, AM02 and AM03 from Japan Synthetic Rubber Company, TOK-TArF-5A-1 and TOK-TArF-6A-1 from Tokyo Ohka Kogyo Co. Ltd, DUV-18L from Brewer Science. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(A-MAA) (poly methyl methacrylate-methacrylic acid); PMMA/IP(MMA-MAA) polymethylmethacrylate/(poly methyl methacrylate-methacrylic acid).

In the production of the microelectronic device of the present invention, one coats and dries the foregoing photosensitive composition on a suitable substrate. The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. In a preferred embodiment of the invention, the photoresist layer is formed by centrally applying a liquid photoresist composition to the upper surface on a rotating wheel at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. The thickness of the photoresist layer may vary depending on the amount of liquid photoresist composition that is applied, but typically the thickness may range from about 500 Å to about 50,000 Å, and preferably from about 2000 Å to about 12000 Å. The amount of photoresist composition which is applied may vary from about 1 ml to about 10 ml, and preferably from about 2 ml to about 8 ml depending on the size of the substrate.

After the resist composition solution is coated onto the substrate, the substrate is temperature treated at approximately 20° C. to 200° C. This temperature treatment is done in order to reduce and control the concentration of residual solvents in the photoresist while not causing substantial thermal degradation of the photosensitizer. In general one desires to minimize the concentration of solvents and thus this temperature treatment is conducted until substantially all of the solvents have evaporated and a thin coating of photoresist composition, on the order of a micron in thickness, remains on the substrate. In a preferred embodiment the temperature is conducted at from about 50° C. to about 150° C. A more preferred range is from about 70° C. to about 90° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful. Treatment times increase to about 20 to about 40 minutes when conducted in a convection oven at these temperatures.

After deposition onto the substrate, the photoresist layer is imagewise exposed, such as via an ArF laser or through a polysilicon etch mask to actinic radiation. This exposure renders the photoresist layer more soluble after exposure than prior to exposure. When such a chemical amplification resist is exposed to light, activated acid induces a catalytic chain reaction to a photoresist film organic polymer, generating a significant amount of protons. In the resist, protons bring a large change into the solubility of the resin. When the photoresist film is irradiated by a high energy beam, e.g. 193 nm, acid ($H^+$) is generated, reacting with the polymer. Acid is again generated and reacts with unreacted polymer. The polymer is then dissolved in a developing solution. In contrast, the polymer at the non-exposed region maintains its structure which is insoluble to the developing solution. With such a mechanism, a good profile pattern can be made on a wafer substrate. The amount of actinic radiation used is an amount sufficient to render the exposed portions of the photoresist layer imagewise soluble in a suitable developer. Preferably, UV radiation is used in an amount sufficient to render the exposed portions of the photoresist layer imagewise soluble is a suitable developer. UV exposure doses preferably range from about 5 $mJ/cm^2$ to about 300 $mJ/cm^2$, more preferably from about 5 $mJ/cm^2$ to about 100 $mJ/cm^2$ and still more preferably from about 10 $mJ/cm^2$ to about 30 $mJ/cm^2$.

Exposure is preferably via an ArF laser, i.e. at a wavelength of from about 193 nm. When an ArF laser is used for exposure, exposure doses preferably ranges from about 1 $mJ/cm^2$ to about 10 $mJ/cm^2$, more preferably from about 2 $mJ/cm^2$ to about 8 $mJ/cm^2$.

Preferably the process further comprises the step of heating the imagewise exposing the photosensitive composition prior to developing, such as by baking, for a sufficient time and temperature to increase the rate at which the acid decomposes the polymer in the imagewise exposed areas of the photosensitive composition. This drives the acid reaction for better image formation. Such a heat treatment may be conducted at temperatures of from about 50° C. to about 150° C., preferably from about 120° C. to about 150° C. for from about 30 seconds to about 2 minutes.

The development step may be conducted by immersion in a suitable developing solution. The solution is preferably agitated, for example, by nitrogen burst agitation. The substrates are allowed to remain in the developer until all, or substantially all, of the resist coating has dissolved from the irradiated areas. Typical examples of the aqueous alkaline solutions suitable as the developer include sodium hydroxide, tetramethylammonium hydroxide, or aqueous solutions of hydroxides of metals belonging to the Groups I and II of the periodic table such as potassium hydroxide. Aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) are preferred. Furthermore, if desired, the aqueous basic solution used as the developer may additionally contain any additives such as a surface active agent in order to improve the resulting development effect. After removal of the coated wafers from the developing solution, an optional, although not required, post-development heat treatment or bake may be employed to increase the adhesion of the coating as well as resistance to etching solutions and other substances. The post-development heat treatment can comprise the oven baking of the coating and substrate below the coating's softening point.

The remaining photoresist layer is then overall exposed to sufficient electron beam radiation to render the patterned image more resistant to an etchant such as oxygen plasma etchants and chlorine etchants. The electron beam irradiating is conducted with a uniform, large-area, overall electron beam exposure source which simultaneously exposes substantially all of the image areas of the photosensitive composition simultaneously. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. The electron beam energy is preferably from about 0.5 to about 30 KeV, and more preferably from about 1 to about 12 KeV and most preferably from about 9 to about 9 KeV. The dose of electrons is from about 1 to about 500,000 $\mu C/cm^2$, preferably from about 50 to about 50,000 $\mu C/cm^2$ and more preferably from about 50 to about 5,000 $\mu C/cm^2$. The gas ambient in the electron beam tool can be any of the following gases: nitrogen, oxygen, hydrogen, argon, xenon, helium, ammonia, silane, a blend of hydrogen and nitrogen, ammonia or any combination of these gases. The electron beam current is preferably from about 1 to about 150 mA, and more preferably from about 1 to about 20 mA. The electron beam irradiating is conducted while the substrate is under a vacuum maintained in the range of from about $10^{-5}$ to about $10^2$ torr. Preferably, the electron beam exposing step is conducted with a wide, large beam of electron beam radiation from a uniform large-are electron beam source which simultaneously covers the entire substrate area, i.e. an area of from about 4 inches to about 256 square inches. The end result of the electron beam treatment will be photoresist layers which are less soluble after exposure than prior to exposure. The resist compositions of the present invention are resistant to acid-base etching solutions and provide effective protection for the unexposed resist-coated areas of the substrate.

The following nonlimiting examples serve to illustrate the invention.

EXAMPLE 1

A layer of 193 nm photoresist (Sumitomo PAR-101A4) was spin-coated onto a blank silicon substrate. The spin coater was a benchtop Laurell model. The dispense volume was 3–4 ml. The resist was spread over the substrate with a slow spin, 1000 rpm for ~10 seconds. Then the spin speed was ramped to 3000 rpm and remained at 3000 rpm for 20 seconds. The photoresist layer and substrate were softbaked at 120° C. for 60 seconds on a hot plate to drive off most of the solvent. The film thickness decreased during the softbake as solvent was evolved. After the softbake the thickness was about 7,000 Å with the coat and bake conditions described above. Each photoresist film was measured with a J. A. Woollam spectroscopic ellipsometer to obtain post-coat thickness and optical constants. A 9-pt map with a 1-inch edge exclusion was used for the measurements. FTIR spectroscopy was also performed to obtain infrared spectra of each film before electron beam cure. Each substrate was then subjected to an electron beam irradiation treatment in the ElectronCure tool made by the Electron Vision Group of Allied Signal. A uniform dose distribution recipe was employed and doses ranged from 10–5,000 $\mu C/cm^2$. Each photoresist film was measured with a J. A. Woollam spectroscopic ellipsometer to obtain post-cure thickness and optical constants. A 9-pt map with a 1-inch edge exclusion was used for the measurements. FTIR spectroscopy was also performed to obtain infrared spectra of each film after electron beam cure. The thickness, optical constants, and infrared spectra of each film before cure were compared to those after cure to determine the extent of film shrinkage and changes to the optical constants. Each photoresist film was then etched for 15 seconds in a plasma etching tool using a standard aluminum etch chemistry ($BCl_3/Cl_2$). Each photoresist film was measured with a J. A. Woollam spectroscopic ellipsometer to obtain post-etch thickness and optical constants. A 9-pt map with a 1-inch edge exclusion was used for the measurements. The thickness of each film after cure were compared to those after etch to determine the etch rate in a metal etch chemistry. A graph of the etch rates at various e-beam doses is shown in the FIG. 1 and Table 1. It can be seen that etch rate decreases sharply as e-beam exposure dose increases.

EXAMPLE 2

A layer of 193 nm photoresist (Shipley XP 7022) was spin-coated onto a blank silicon substrate. The spin coater was a benchtop Laurell model. The dispense volume was 3–4 ml. The resist was spread over the substrate with a slow spin, 1000 rpm for ~10 seconds. Then the spin speed was ramped to 3000 rpm and remained at 3000 rpm for 20 seconds. The photoresist layer and substrate were softbaked at 140° C. for 60 seconds on a hot plate to drive off most of the solvent. The film thickness decreased during the softbake as solvent was evolved. After the softbake the thickness was about 6,000 Å with the coat and bake conditions described above. Each photoresist film was measured with a J. A. Woollam spectroscopic ellipsometer to obtain post-coat thickness and optical constants. A 9-pt map with a 1-inch edge exclusion was used for the measurements. FTIR spectroscopy was also performed to obtain infrared spectra of each film before electron beam cure. Each substrate was then subjected to an electron beam irradiation treatment in the ElectronCure tool made by the Electron Vision Group of Allied Signal. A uniform dose distribution recipe was employed and doses ranged from 10–5,000 $\mu C/cm^2$. Each photoresist film was measured with a J. A. Woollam spectroscopic ellipsometer to obtain post-cure thickness and optical constants. A 9-pt map with a 1-inch edge exclusion was used for the measurements. FTIR spectroscopy was also performed to obtain infrared spectra of each film after electron beam cure. The thickness, optical constants, and infrared spectra of each film before cure were compared to those after cure to determine the extent of film shrinkage and changes to the optical constants. Each photoresist film was then etched for 15 seconds in a plasma etching tool using a standard aluminum etch chemistry ($BCl_3/Cl_2$). Each photoresist film was measured with a J. A. Woollam spectroscopic ellipsometer to obtain post-etch thickness and optical constants. A 9-pt map with a 1-inch edge exclusion was used for the measurements. The thickness of each film after cure were compared to those after etch to determine the etch rate in a metal etch chemistry. Graphs of etch rates are shown in the FIG. 1 and Table 1. It can be seen that etch rate decreases sharply as e-beam exposure dose increases.

EXAMPLE 3

Comparative

A layer of a 248 nm photoresist (Japan Synthetic Rubber Co. KRFM20G) was spin-coated onto a blank silicon substrate. The spin coater was a benchtop Laurell model. The dispense volume was 3–4 ml. The resist was spread over the substrate with a slow spin, 1000 rpm for ~10 seconds. Then the spin speed was ramped to 3000 rpm and remained at 3000 rpm for 20 seconds. The photoresist layer and substrate were softbaked at 140° C. for 60 seconds on a hot plate to drive off most of the solvent. The film thickness decreased during the softbake as solvent was evolved. After the softbake the thickness was about 7,000 Å with the coat and bake conditions described above. Each photoresist film was measured with a J. A. Woollam spectroscopic ellipsometer to obtain post-coat thickness and optical constants. A 9-pt map with a 1-inch edge exclusion was used for the measurements. FTIR spectroscopy was also performed to obtain infrared spectra of each film before electron beam cure. Each substrate was then subjected to an electron beam irradiation treatment in the ElectronCure tool made by the Electron Vision Group of Allied Signal. A uniform dose distribution recipe was employed and doses ranged from 10–5,000 $\mu C/cm^2$. Each photoresist film was measured with a J. A. Woollam spectroscopic ellipsometer to obtain post-cure thickness and optical constants. A 9-pt map with a 1-inch edge exclusion was used for the measurements. FTIR spectroscopy was also performed to obtain infrared spectra of each film after electron beam cure. The thickness, optical constants, and infrared spectra of each film before cure were compared to those after cure to determine the extent of film shrinkage and changes to the optical constants. Each photoresist film was then etched for 15 seconds in a plasma etching tool using a standard aluminum etch chemistry ($BCl_3/Cl_2$). Each photoresist film was measured with a J. A. Woollam spectroscopic ellipsometer to obtain post-etch thickness and optical constants. A 9-pt map with a 1-inch edge exclusion was used for the measurements. The thickness of each film after cure were compared to those after etch to determine the etch rate in a metal etch chemistry. Graphs of etch rates are shown in the FIG. 1 and Table 1. It can be seen that etch rate differences are insignificant for an e-beam exposed 248 nm resist.

TABLE 1

| | ETCH RATES Å/minute | | |
|---|---|---|---|
| E-BEAM DOSE ($\mu c/cm^2$) | EXAMPLE 3 | EXAMPLE 2 | EXAMPLE 1 |
| 10 | 4251 | 4760 | 4508 |
| 20 | 3793 | | |
| 50 | 3751 | | |
| 100 | 3841 | 4464 | 4380 |
| 200 | 3942 | | |
| 500 | 3965 | 3436 | 2788 |
| 1000 | | 2932 | 2128 |
| 2000 | 3802 | | |
| 5000 | 3526 | 2312 | 1612 |

EXAMPLE 4

A layer of 193 nm photoresist (e.g., Sumitomo PAR-101A4) is spin-coated onto a substrate, such as a silicon substrate. This substrate has some semiconductor structures already in it. The spin coater is a benchtop Laurell spinner. The dispense volume is 3–4 ml. The resist is spread over the substrate with a slow spin, 700–1000 rpm for ~10 seconds. Then the spin speed is ramped to 3000 rpm and remains there for 20–30 seconds. The photoresist layer and substrate are softbaked at 120° C. for 60 seconds on a hot plate to drive off most of the solvent. The film thickness decreases during the softbake as solvent is evolved. After the softbake the thickness is about 7,000 Å (with the coat and bake conditions described above). The photoresist film is exposed to actinic radiation; in this case, radiation of 193 nm wavelength, by a 193 nm stepper such as ISI ArF Microstepper, SVGL 193 Micrascan or ASML PAS 5500/ 900, with a numerical aperture of ~0.6 and a typical exposure dose of 5–10 $mJ/cm^2$. This causes photoacid to be generated. The photoresist film undergoes a post-exposure bake at 120° C. for 60 seconds to thermally activate the deprotection reaction. The result is an ideally large differential dissolution between the exposed and unexposed areas. The photoresist film is developed in an industry-standard 2.38 wt % aqueous TMAH (tetramethylammonium hydroxide) developer solution. The exposed areas are dissolved away (for a positive photoresist) and the unexposed areas are left, forming the desired resist pattern. Photoresist residue is removed from the substrate in an oxygen plasma de-scumming process. The substrate then undergoes the electron beam irradiation treatment in the ElectronCure tool made by the Electron Vision Group of Allied Signal. The electron beam process modifies the photoresist film (perhaps initiates crosslinking) to make it more thermally stable and mechanically robust, in preparation for etch processing or ion implantation. FTIR analysis indicates crosslinking of the electron beam exposed surface.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have discussed above, and all equivalents thereto.

What is claimed is:

1. A process for producing an etch resistant image which comprises:
    (a) coating and drying a photosensitive composition onto a substrate, which photosensitive composition comprises
        (i) at least one water insoluble, acid decomposable polymer which is substantially transparent to ultraviolet radiation at a wavelength of about 193 nm, wherein said polymer is present in the photosensitive composition in an amount sufficient to form a uniform film of the composition components when it is coated on a substrate and dried;
        (ii) at least one photosensitive compound capable of generating an acid upon exposure to sufficient activating energy at a wavelength of about 193 nm, said photosensitive compound being present in an amount sufficient to substantially uniformly photosensitize the photosensitive composition;
    (b) imagewise exposing the photosensitive composition to sufficient activating energy at a wavelength of 193 nm to cause the photosensitive compound to generate sufficient acid to decompose the polymer in the imagewise exposed areas of the photosensitive composition;
    (c) developing the photosensitive composition to thereby remove the exposed nonimage areas and leaving the unexposed image areas of the photosensitive composition;
    (d) irradiating the image areas of the photosensitive composition to sufficient electron beam radiation to thereby increase the resistance of the photosensitive composition in the image areas to an etchant.

2. The process of claim 1 wherein the polymer comprises an olefin, an acrylate, a methacrylate, a norbornene containing polymer, an alicyclic polymer or combinations thereof.

3. The process of claim 1 wherein the polymer comprises a polyalkylacrylate or a polyalkylmethacrylate.

4. The process of claim 1 wherein the polymer has a molecular weight in the range of from about 1,000 to about 800,000.

5. The process of claim 1 wherein the photosensitive compound comprises an onium compound.

6. The process of claim 1 wherein the photosensitive compound comprises a sulfonium, iodonium or diazonium compound.

7. The process of claim 1 wherein the substrate is selected from the group consisting of silicon, aluminum, lithium niobate, polymeric resins, silicon dioxide, doped silicon dioxide, gallium arsenide, Group III/V compounds, silicon nitride, tantalum, copper, polysilicon, ceramics and aluminum/copper mixtures.

8. The process of claim 1 wherein the exposing is conducted with an ArF laser.

9. The process of claim 1 wherein the exposing is conducted with an ArF laser at an exposure dose of from about 1 $mJ/cm^2$ to about 10 $mJ/cm^2$.

10. The process of claim 1 wherein the photosensitive composition further comprises one or more residual solvents selected from the group consisting of propylene glycol alkyl ether, butyl acetate, ethylene glycol monoethyl ether acetate, diglyme, cyclopentanone and propylene glycol methyl ether acetate.

11. The process of claim 1 wherein said polymer is present in the photosensitive composition in an amount of from about 50% to about 99%, and the photosensitive compound is present in an amount of from about 1% to about 20% based on the weight of the non-solvent parts of the photosensitive composition.

12. The process of claim 1 wherein the photosensitive composition further comprises one or more components selected from the group consisting of non-aromatic colorants, dyes, anti-striation agents, leveling agents, crosslinkers, plasticizers, adhesion promoters, speed enhancers, solvents, dissolution inhibitors, acid generators and surfactants.

13. The process of claim 1 wherein the developing is conducted with an aqueous alkaline solution.

14. The process of claim 1 wherein the developing is conducted with a metal ion free aqueous alkaline solution.

15. The process of claim 1 wherein the developing is conducted with an aqueous alkaline solution comprising sodium hydroxide, potassium hydroxide, tetramethyl ammonium hydroxide or mixtures thereof.

16. The process of claim 1 wherein the electron beam irradiating is conducted with a uniform, large-area, overall electron beam exposure source which simultaneously exposes substantially all of the image areas of the photosensitive composition simultaneously.

17. The process of claim 1 wherein the electron beam irradiating is conducted with a uniform large-area electron beam source which covers an exposure area of from about 4 square inches to about 256 square inches simultaneously.

18. The process of claim 1 wherein the electron beam irradiating is conducted with a source which generates an electron beam energy level ranging from about 0.5 to about 30 KeV.

19. The process of claim 1 wherein the electron beam irradiating is from a source which generates an electron dose ranging from about 1 to about 500,000 $\mu C/^2$.

20. The process of claim 1 wherein the electron beam irradiating is conducted from a source which generates an electron beam current of from about 1 to about 150 mA.

21. The process of claim 1 wherein the electron beam irradiating is conducted while heating the substrate to a temperature of from about 20° C. to about 450° C.

22. The process of claim 1 wherein the electron beam irradiating is conducted in a gas selected from the group consisting of nitrogen, oxygen, hydrogen, argon, xenon, helium, ammonia, silane, a blend of hydrogen and nitrogen, ammonia and mixtures thereof.

23. The process of claim 1 wherein the electron beam irradiating is conducted while the substrate is under a vacuum maintained in the range of from about $10^{-5}$ to about $10^2$ torr.

24. The process of claim 1 further comprising the step of heating the imagewise exposed photosensitive composition prior to developing, for a sufficient time and temperature to increase the rate at which the acid decomposes the polymer in the imagewise exposed areas of the photosensitive composition.

25. A process for producing a microelectronic device image which comprises:
   (a) coating and drying a photosensitive composition onto a semiconductor substrate, which photosensitive composition comprises
      (i) at least one water insoluble, acid decomposable polymer which is substantially transparent to ultraviolet radiation at a wavelength of about 193 nm, wherein said polymer is present in the photosensitive composition in an amount sufficient to form a uniform film of the composition components when it is coated on a substrate and dried;
      (ii) at least one photosensitive compound capable of generating an acid upon exposure to sufficient activating energy at a wavelength of about 193 nm, said photosensitive compound being present in an amount sufficient to substantially uniformly photosensitize the photosensitive composition;
   (b) imagewise exposing the photosensitive composition to sufficient activating energy at a wavelength of 193 nm to cause the photosensitive compound to generate sufficient acid to decompose the polymer in the imagewise exposed areas of the photosensitive composition;
   (c) developing the photosensitive composition to thereby remove the exposed nonimage areas and leaving the unexposed image areas of the photosensitive composition;
   (d) irradiating the image areas of the photosensitive composition to sufficient electron beam radiation to thereby increase the resistance of the photosensitive composition in the image areas to an etchant.

26. The process of claim 25 further comprising the step of heating the imagewise exposing the photosensitive composition prior to developing, for a sufficient time and temperature to increase the rate at which the acid decomposes the polymer in the imagewise exposed areas of the photosensitive composition.

27. A microelectronic device image produced by a process which comprises:
   (a) coating and drying a photosensitive composition onto a semiconductor substrate, which photosensitive composition comprises
      (i) at least one water insoluble, acid decomposable polymer which is substantially transparent to ultraviolet radiation at a wavelength of about 193 nm, wherein said polymer is present in the photosensitive composition in an amount sufficient to form a uniform film of the composition components when it is coated on a substrate and dried;
      (ii) at least one photosensitive compound capable of generating an acid upon exposure to sufficient activating energy at a wavelength of about 193 nm, said photosensitive compound being present in an amount sufficient to substantially uniformly photosensitive the photosensitive composition;
   (b) imagewise exposing the photosensitive composition to sufficient activating energy at a wavelength of 193 nm to cause the photosensitive compound to generate sufficient acid to decompose the polymer in the imagewise exposed areas of the photosensitive composition;
   (c) developing the photosensitive composition to thereby remove the exposed nonimage areas and leaving the unexposed image areas of the photosensitive composition;
   (d) irradiating the image areas of the photosensitive composition to sufficient electron beam radiation to thereby increase the resistance of the photosensitive composition in the image areas to an etchant.

28. The microelectronic device image produced by the process of claim 27 which further comprises the step of heating the imagewise exposing the photosensitive composition prior to developing, for a sufficient time and temperature to increase the rate at which the acid decomposes the polymer in the imagewise exposed areas of the photosensitive composition.

* * * * *